(12) United States Patent
Yunus

(10) Patent No.: US 7,190,564 B2
(45) Date of Patent: Mar. 13, 2007

(54) SNUBBER CIRCUIT

(75) Inventor: Haroon I. Yunus, New Hartford, CT (US)

(73) Assignee: The Bergquist Torrington Company, Torrington, CT (US)

(*) Notice: Subject to any disclaimer, the term of this patent is extended or adjusted under 35 U.S.C. 154(b) by 118 days.

(21) Appl. No.: 10/956,913

(22) Filed: Sep. 30, 2004

(65) Prior Publication Data

US 2006/0072259 A1    Apr. 6, 2006

(51) Int. Cl.
*H02H 3/20* (2006.01)
(52) U.S. Cl. ..................................... 361/91.7
(58) Field of Classification Search ............... 361/91.7
See application file for complete search history.

(56) References Cited

U.S. PATENT DOCUMENTS

| | | | | |
|---|---|---|---|---|
| 5,946,178 A | * | 8/1999 | Bijlenga | 361/91.5 |
| 6,724,357 B2 | * | 4/2004 | Kim et al. | 345/60 |
| 2005/0180179 A1 | * | 8/2005 | Hirst | 363/21.07 |

* cited by examiner

*Primary Examiner*—Ronald W. Leja
(74) *Attorney, Agent, or Firm*—Haugen Law Firm PLLP

(57) ABSTRACT

A snubber circuit for use with an integrated power supply control circuit incorporating a transformer and a lateral power MOSFET on a single silicon chip. A capacitor is provided in circuit with the MOSFET and first resistor and diode are in series with each other and the capacitor. A second resistor and diode are also in series with each other and the capacitor. The diodes provide for first current flow in one and an opposite direction and the resistors provide first and second levels of resistance respectively for damping and turn on.

4 Claims, 3 Drawing Sheets

SNUBBER CIRCUIT

BACKGROUND OF INVENTION

Snubber circuits have many applications in power electronics circuits such as voltage and or current rise limiters, level clamps, EMI limiters, and damping networks. Prior art snubber circuits, to be discussed hereinbelow, control the snubbing action under one set of circuit conditions, i.e. during switch on or switch off time. Snubbing is accomplished by selectively storing energy in a capacitor during one portion of an operating cycle and discharging the energy during a second portion of the cycle.

Using such a snubber with integrated power supply control circuits may pose a problem, in that the control circuit may shut down while trying to absorb the energy stored in the capacitor. Reducing the size of the snubber capacitor of course solves this problem but may well result in a capacitor incapable of controlling the ringing.

A general object of the present invention is to provide a snubber circuit which can provide two levels of current flow respectively well suited to control ringing and turn on.

SUMMARY OF THE INVENTION

In fulfillment of the foregoing object and in accordance with the present invention, a snubber circuit is provided for use with an integrated power supply control circuit incorporating an inductance generating element and a lateral power MOSFET (Metal Oxide Semiconductor Field-Effects Transistor) on a single silicon chip and comprises a capacitor in circuit with at least part of the MOSFET. At least one resistor and at least one unidirectional element (preferably a diode) are arranged relative to each other to provide different first and second current flows respectively for damping ringing and for turn on.

In a somewhat more sophisticated design, a first resistor and a first unidirectional element, preferably a diode, in series with each other and with the capacitor are provided in parallel arrangement with a second resistor and second unidirectional element also in series with each other and the capacitor. The diodes are arranged to provide for current flow in one and an opposite direction to and from the capacitor and the first and second resistors respectively provide a first level of resistance for damping during ringing and a second and different level of resistance during current flow in the opposite direction during turn on.

In another embodiment, a pair of resistors are arranged in series with a capacitor with a diode across one resistor, the resistance across one resistor being selected for damping and the combined resistance across the two resistors being different for turn on. First level of current during damping and a second level of current for turn on.

DESCRIPTION OF PREFERRED EMBODIMENTS

Figure 1C:
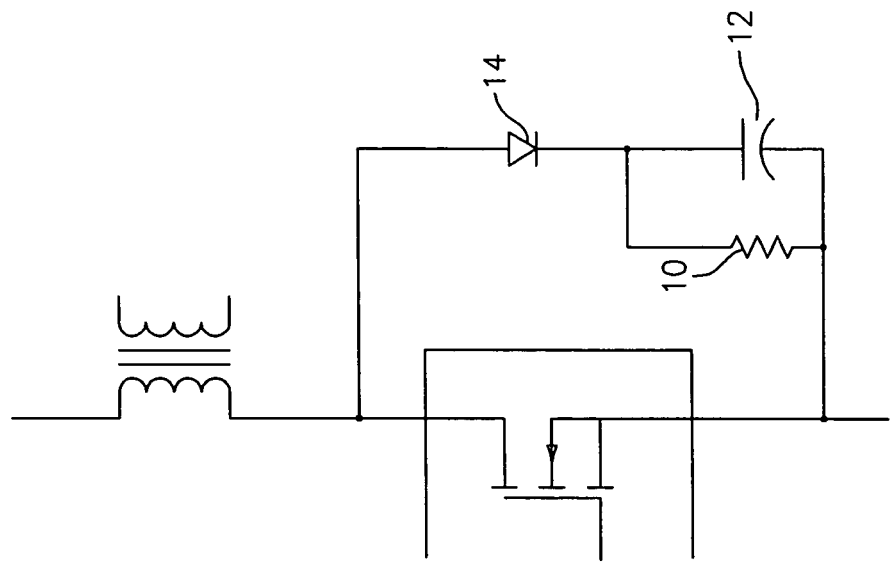
FIGS. 1a, 1b, and 1c illustrate three different prior art snubber circuits.
Figure 1B:
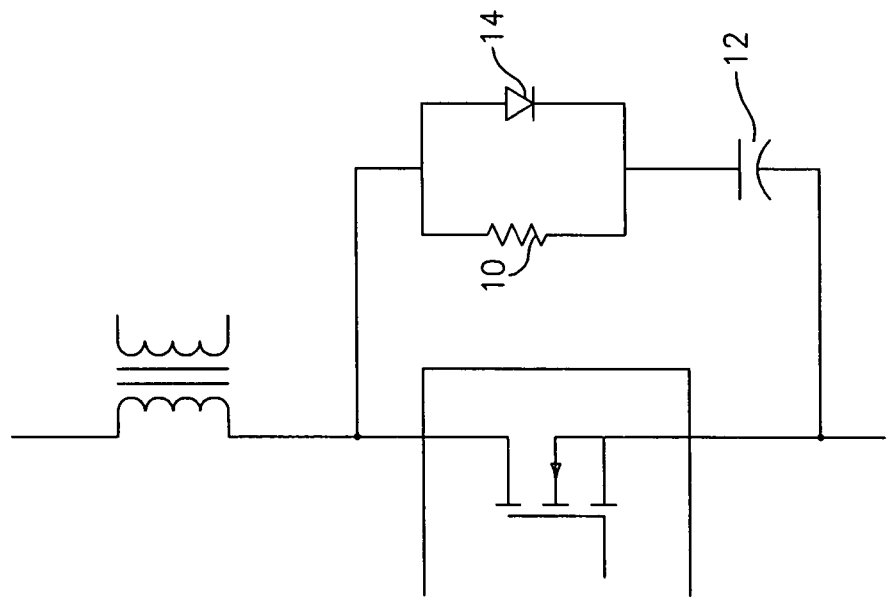
Figure 1A:
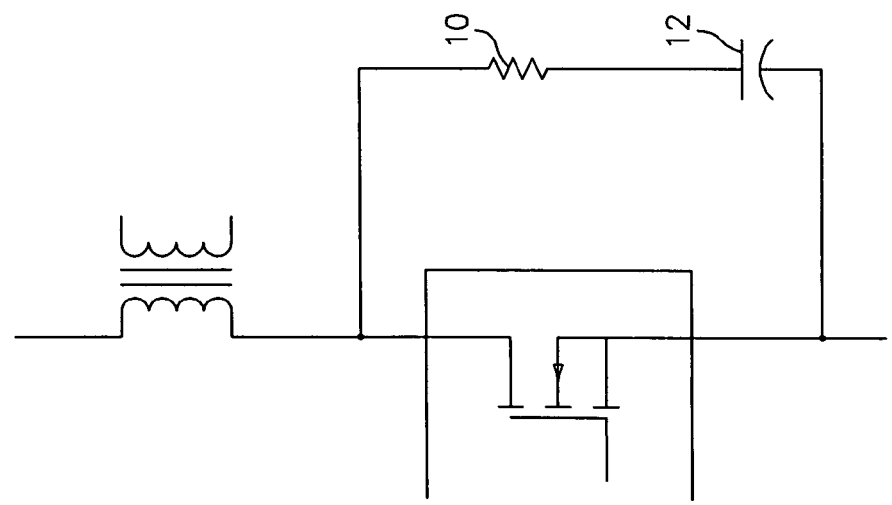

FIG. 1a shows the simplest form of a snubber circuit. Resistor 10 affects charging and discharging of capacitor 12 equally. This limits the amount of energy that can be stored to the amount which can be discharged during the shortest period of the operating cycle.

In FIG. 1b illustrates that this limitation can be overcome by adding a diode 14 through which the capacitor charges. Thus, the capacitor can have a smaller value than in FIG. 1a. However the resistor still needs to be sized to discharge this energy during the off time of the switch.

The circuit of FIG. 1c acts to limit the resonant voltage swings to a determined value, which will change depending on duty cycle.

Using a snubber circuit of the type described with Integrated power supply control circuits poses a problem, in that the control circuit will shut down trying to absorb the energy stored in the snubber capacitor. Reducing the size of the capacitor solves the turn off problem but results in inadequate control of ringing.

Figure 2:
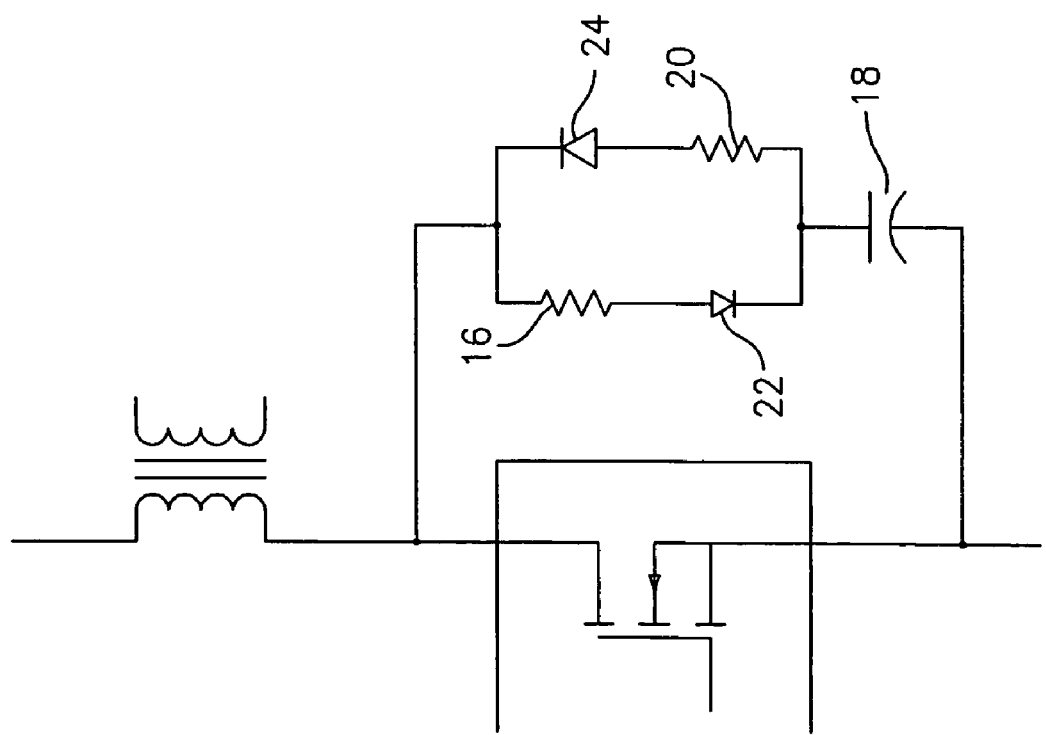
FIG. 2 illustrates a first embodiment of the improved snubber circuit of the present invention.

In the snubber circuit of the present invention shown in FIG. 2, a resistor 16 is arranged in series with capacitor 18 at MOSFET (Metal Oxide Semiconductor Field-Effects Transistor) turn off. This resistor helps dampen the voltage ringing on the drain terminal but in order to avoid undesired shut down of the MOSFET, a higher value of resistance is required during turn on. Resistor 20 serves this need and diodes 22 and 24 provide for current flow in one and an opposite direction as required.

Figure 4:
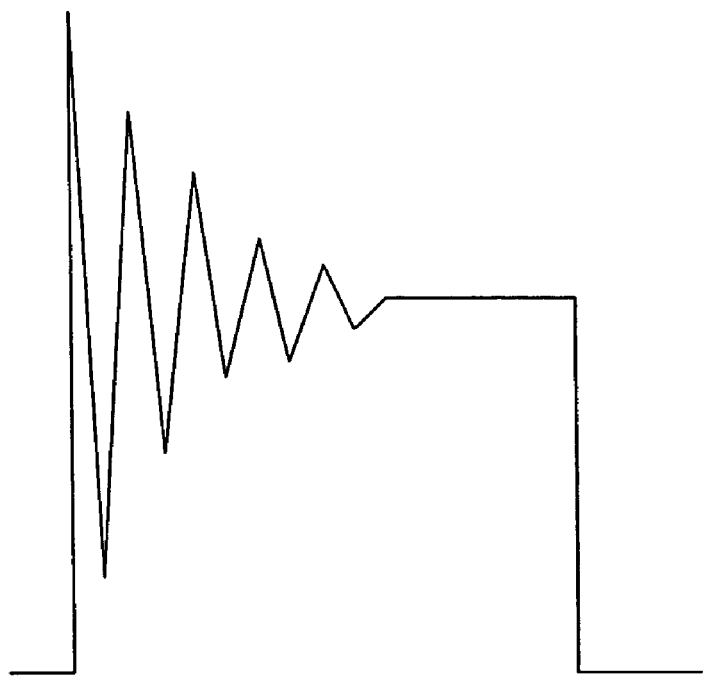
FIG. 4 is a first plot of ringing with prior art circuits.
Figure 5:
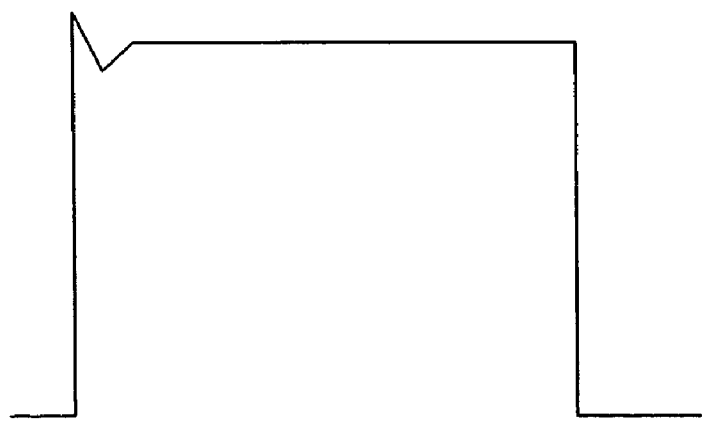
FIG. 5 is a second plot showing reduced ringing with snubber circuits of the present invention.

FIGS. 4 and 5 illustrate the results of the foregoing. Absent the snubber circuit such as shown in FIG. 2, turn off ringing such as that shown in FIG. 4 results and may cause excessive heating in the output diode of the power converter, as well as excessive EMI. Conventional snubbers do not solve the problem due to the design of the MOSFET. With the snubber circuit of FIG. 2, highly efficient damping is achieved as illustrated in FIG. 5.

Figure 3:
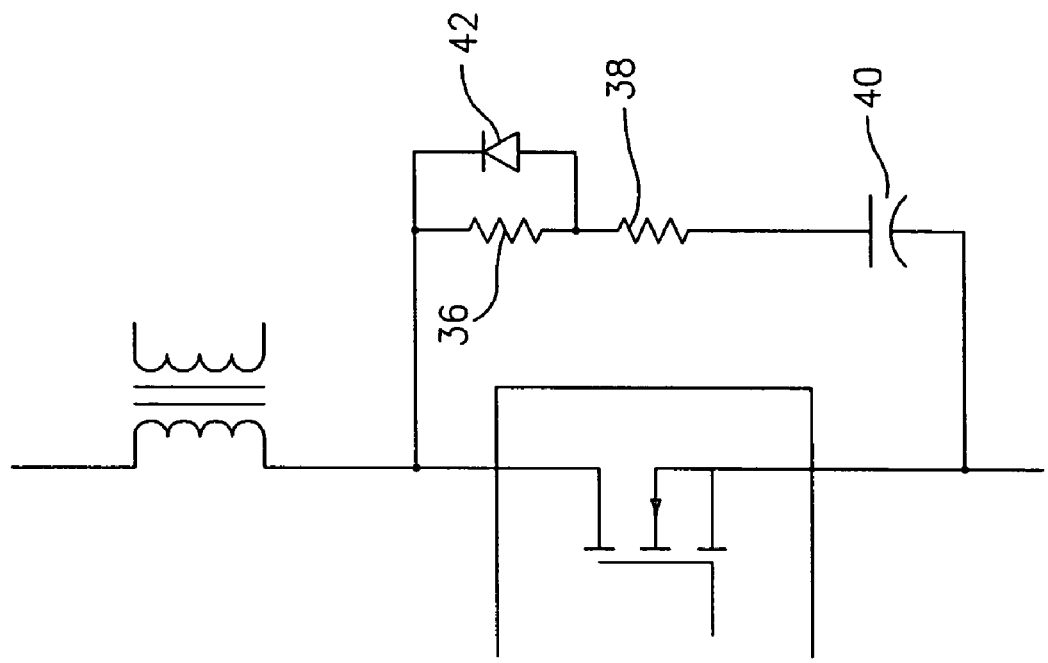
FIG. 3 illustrates a second embodiment of the snubber circuit.

FIG. 3 shows first and second resistors 36 and 38 and capacitor 40 connected in series and diode 42 connected across resistor 36. As will be apparent, the resistance across one resistor is effective for damping and the resistance across both is effective for turn on.

As will be apparent with either the FIG. 2 or FIG. 3 snubber circuit, different resistance and/or current, which may be either higher or lower, is provided as required for damping and turn on.

The invention claimed is:

1. A snubber circuit for use with a power supply control circuit incorporating a power MOSFET (Metal Oxide Semiconductor Field—Effects Transistor) on a single integrated circuit, said snubber circuit comprising a capacitor in circuit with the MOSFET, a first resistor and a first unidirectional element in series with each other and the capacitor and in parallel arrangement with a second resistor and a second unidirectional element in series with each other and with the capacitor, said first and second unidirectional elements providing for current flow in one and an opposite direction to and from the capacitor and said first and second resistors providing respectively a first level of resistance for damping ringing during current flow in one direction and a second and different level of resistance during current flow in the opposite direction.

2. A snubber circuit as set forth in claim 1 wherein the unidirectional elements take the form of diodes.

3. A snubber circuit as set forth in claim 1 wherein the MOSFET is a lateral MOSFET.

4. A snubber circuit as set forth in claim 1 wherein one current flow is well suited for damping ringing and the other for turn on.

* * * * *